United States Patent [19]

Oakes

[11] 3,763,550

[45] Oct. 9, 1973

[54] GEOMETRY FOR A PNP SILICON TRANSISTOR WITH OVERLAY CONTACTS

[75] Inventor: James A. Oakes, Kokomo, Ind.

[73] Assignee: General Motors Corporation, Detroit, Mich.

[22] Filed: Apr. 13, 1972

[21] Appl. No.: 243,667

Related U.S. Application Data

[60] Division of Ser. No. 94,854, Dec. 3, 1970, Pat. No. 3,697,828, which is a continuation-in-part of Ser. No. 846,378, July 31, 1969, abandoned.

[52] U.S. Cl. .................................... 29/578, 29/589

[51] Int. Cl. .............................................. B01j 17/00

[58] Field of Search ...................... 29/578, 580, 589, 29/590, 591

[56] References Cited

UNITED STATES PATENTS

| | | | |
|---|---|---|---|
| 3,373,323 | 3/1968 | Wolfrum et al. | 317/235 |
| 3,491,273 | 1/1970 | Stiegler | 317/235 |
| 3,518,506 | 6/1970 | Gates | 317/235 |
| 3,547,604 | 12/1970 | Davis et al. | 317/235 |

*Primary Examiner*—Charles W. Lanham
*Assistant Examiner*—W. Tupman
*Attorney*—Williams, Pettigrew et al.

[57] ABSTRACT

A semiconductor device having an expanded guard ring overlying substantially the entire surface of a region except for at least one island therein. A relatively thin protective coating overlies the guard ring and a relatively thick protective coating overlies the island. A terminal connector contact for a wire-bonded or flip-chip device is formed on the relatively thick island portion of the protective coating, which is more suitable for withstanding bonding pressure. One form of this device includes a PNP transistor having an expanded P+ guard ring overlying a substantial portion of the collector surface noncontiguously closely surrounding the base region of the transistor. Islands of original P-type material having a relatively thick oxide coating thereon are left within the expanded P+ guard ring to support wire-bonding or flip-chip contact pads.

2 Claims, 4 Drawing Figures

GEOMETRY FOR A PNP SILICON TRANSISTOR WITH OVERLAY CONTACTS

RELATED APPLICATION

This application is a division of my U.S. Pat. application Ser. No. 94,854, now U.S. Pat. No. 3,697,828, entitled "A Geometry for a PNP Silicon Transistor with Overlay Contacts," filed Dec. 3, 1970, and assigned to the assignee of this application. U.S. Ser. No. 94,854 is a continuation-in-part of my earlier filed U.S. Pat. application Ser. No. 846,378, filed July 31, 1969, entitled "A Geometry for a PNP Silicon Transistor with Overlay Contacts" and now abandoned.

BACKGROUND OF THE INVENTION

This invention relates to a semiconductor device and more particularly to a PNP transistor.

Impurities or mechanical defects present on or adjacent the surface of semiconductive materials can detrimentally affect their electrical characteristics. This is generally true for a silicon planar-type device. In a silicon planar-type device surface impurities at or adjacent the interface of a silicon surface and a coating of silicon oxide can cause channeling to occur. Channeling is essentially the inversion of a surface area or portion thereof of one conductivity type to that of an opposite conductivity type. This inversion, if it exists across the entire surface area of a region, could short circuit the region.

As the resistivity of a region is increased, the tendency for channels to form therein is stronger. As the resistivity of the region is decreased, the opposite is true. Consequently, channels are often prevented from existing completely across a region by highly doping a narrow surface strip of the region. However, if channels exist on opposite sides of the highly doped strip, short circuiting may still occur. Conductive impurities on or in the strip can interconnect channels across a strip. Furthermore, incorrect alignment of a mask used to make the narrow strip can result in an incomplete strip. This could leave a path in which a channel could short circuit across a region. As a consequence of the foregoing, these highly doped strips or guard rings as they are referred to, have been made rather wide. In fact, in some applications, substantially the entire surface area of a region susceptible to channeling is highly doped, to form an expanded guard ring.

Silicon planar-type PNP transistors are often subject to channeling across the surface of the collector region. In such a PNP transistor one would form a P+ diffusion region completely across the collector surface except for a narrow border surrounding the base region. However, the P+ diffusion treatment requires removing the thick oxide coating on the collector surface prior to the P+ diffusion. The thickness of the silicon oxide coating that is reformed over the P+ region is small by comparison to the oxide coating thickness that results from the additive effects of all the steps in the fabrication process.

The small size of many planar-type structures often dictates that evaporated overlay type contacts be used to make electrical connections with the base and emitter regions. These emitter and base overlay contacts generally include a small electrode portion that is integrally connected to a relatively large bonding pad portion to which a lead wire can be secured. The electrode portions of the contacts electrically communicate with the respective base and emitter regions through small openings in the oxide coating overlying the regions. From the electrode the contact extends out over the top surface of the oxide to the bonding pad portion, which lays over the collector region. External circuit connections are bonded to the bonding pad of the overlay contact. These external connections are usually made by conventional pressure bonding techniques, such as thermocompression or ultrasonic bonding.

I have found that if an expanded guard ring is used over the entire collector surface, the thin oxide over the guard ring can be deleteriously affected due to the pressure of thermocompression or ultrasonic bonding operations. Moreover, this oxide must be impervious to withstand collector-base and emitter-collector potential differences. As a consequence of the aforesaid bonding operations, short circuit can develop under the emitter and base terminal wire bonding pads. The deleterious conditions through which short circuits can develop may not be apparent immediately. However, the oxide coating can be weakened sufficiently for them to subsequently appear and detrimentally affect the in-service reliability of the device.

In addition, I have found that this same type of problem can occur with face-bonded transistor chips as well. Face-bonded chips have enlarged contact bumps on their face that are usually pressure bonded to connecting terminal leads. I have found that the pressures used are frequently high enough to deleteriously affect a thin underlying oxide coating, even when pressure bonding is only used to tack the chips and leads together as a preparation for reflow soldering.

SUMMARY OF THE INVENTION

It is a principal object of this invention to provide a means for inhibiting oxide cracking in a transistor chip subjected to pressure bonding without compromising any of the potential benefits of the expanded guard ring concept.

Another object of this invention is to provide an improved planar-type silicon PNP transistor of both the wire-bonded and face-bonded type.

Still another object of this invention is to provide an improved technique for making such transistors.

These and other objects of the invention are accomplished by using a thick refractory coating under the terminal connector contact pads overlying the guard ring in the collector region. This is accomplished in a single step by leaving an unaltered island of the original collector region disposed entirely within the guard region upon which the terminal connector contact pads are formed. This unaltered island will inherently have a significantly thicker oxide, which can withstand the rigors of pressure bonding operations.

BRIEF DESCRIPTION OF THE DRAWINGS

Other objects, features and advantages of this invention will become more apparent from the following description of the preferred example and from the drawings, in which.

Figure 1:
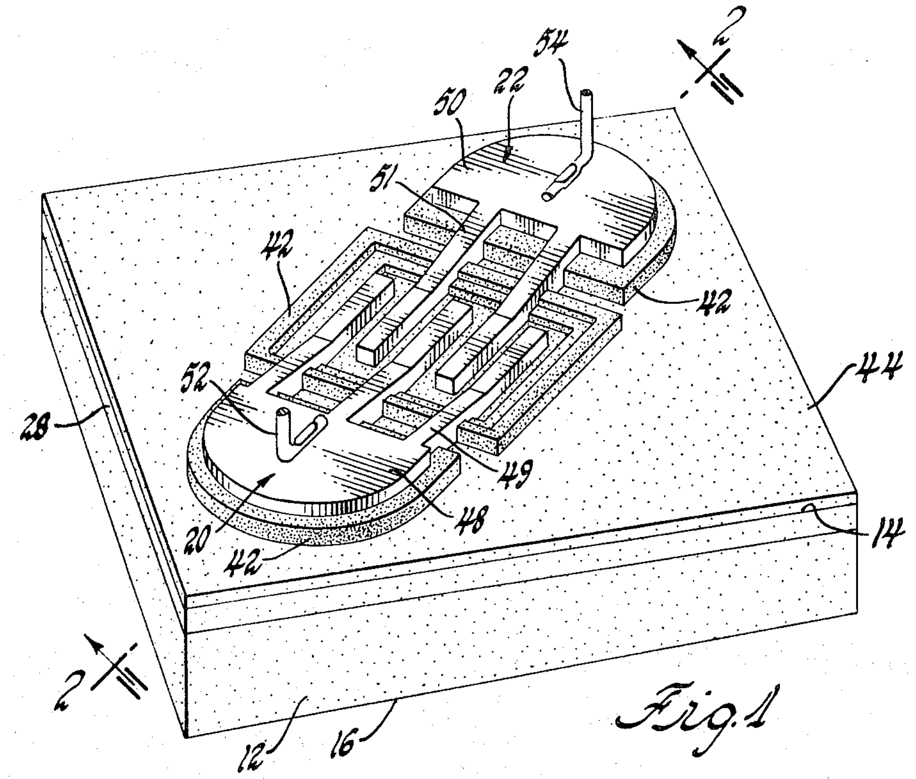
FIG. 1 is a perspective view of a semiconductive device made in accordance with this invention.

DETAILED DESCRIPTION OF THE PREFERRED EMBODIMENT:

Reference is now made to the Figures, and more particularly to FIG. 1 which shows a silicon planar-type PNP transistor. The transistor includes a P-type silicon wafer 12 with major surfaces 14 and 16 each having length and width dimensions of about 0.020 inch. The thickness of wafer 12 is about 8 mils. Disposed on surface 14 are protective refractory coatings of silicon oxide and aluminum overlay contacts 20 and 22.

Figure 2:
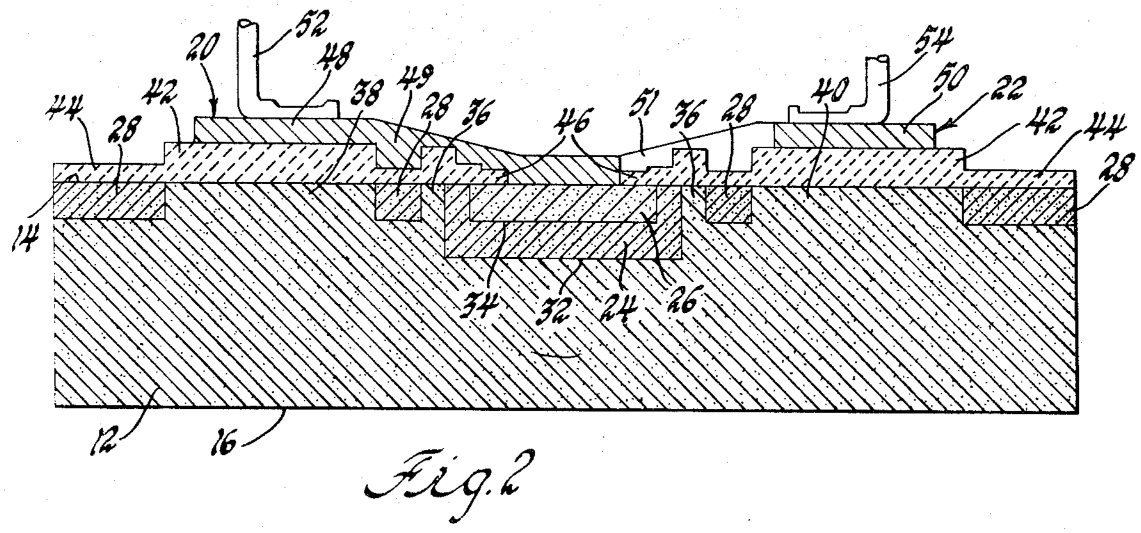
FIG. 2 is a sectional view taken along lines 2—2 of FIG. 1.

Referring now to FIG. 2 which diagrammatically shows distinct conductivity type regions within wafer 12, all of which extend to surface 14. These regions include an N-type conductivity base region 24, a P-type conductivity emitter region 26 within region 24 and a P+ type conductivity expanded guard ring region 28. The collector region of the transistor constitutes that portion of wafer 12 that is not emitter region 26, base region 24 and P+ region 28. Accordingly, collector-base PN junction 32 exists at the interface of region 24 and wafer 12. An emitter-base PN junction 34 exists at the interface of region 24 and 26.

Base region 24 has width and length dimensions on surface 14 of about 0.007 inch and is surrounded thereon by a narrow collector border 36 about 0.001 inch wide. Border 36 is spaced at least 0.005 inch from the periphery of surface 14. P+ region 28 contiguously surrounds border 36 and noncontiguously surrounds base region 24 on surface 14 being spaced from region 24 by the narrow collector border 36. P+ region 28 extends from border 36 to the periphery of surface 14 except for two collector islands 38 and 40 therein. Collector islands 38 and 40 are adjacent opposing sides of border 36 and spaced outwardly therefrom about 0.001 inch. These islands are of semicircular-like shape on surface 14 having a maximum dimension thereon of about 0.006 inch and are spaced from the periphery of surface 14 about 0.001 inch.

Overlying collector border 36 and collector islands 38 and 40 is a relatively thick protective refractory coating 42 of silicon oxide. Coating 42 is about 9,000 angstroms thick. Overlying P+ region 28 and a portion of emitter region 26 is a relatively thin coating 44 of silicon oxide. Coating 44 is about 1,200 angstroms thick. A silicon oxide coating 46 of intermediate thickness overlies the base-emitter junction on the wafer surface.

Overlay contacts 20 and 22 each of which are about 10,000 angstroms thick electrically communicate with emitter region 26 and base region 24 respectively. The overlay contacts which are evaporated onto the coatings of silicon oxide each includes a bonding pad and integrally formed electrodes. Emitter bonding pad 48 overlies island 38 and base bonding pad 50 overlies island 40. Interdigitated electrodes 49 and 51 extend from pads 48 and 50, respectively, to engage the base and emitter regions through appropriate openings in the oxide coating. Emitter wire connector 52 and base wire connector 54 are bonded to pads 48 and 50 respectively by conventional and well known pressure bonding techniques. In pressure bonding the connectors to the respective pads, most of the force is exerted normal to surface 14. It should be pointed out with reference to the Figures that the overlay contacts are not drawn to scale. Furthermore, they do not exactly duplicate the undulations in the contact between the bonding pads and the eletrodes over the oxide coating of varying thickness. The contact is shown tapered instead in this area for ease of illustration and visualization.

It should be appreciated that although the preferred embodiment has been described as having a relatively thick oxide coating of about 9,000 angstroms, for some applications other devices embodying this inventive concept might be manufactured having island oxide coatings as thin as 5,000 angstroms. However, it is preferred that thicker island oxide coatings be used to insure satisfactory results.

It should be further appreciated that although the herein described preferred embodiment is a transistor requiring only two collector islands within the expanded guard ring, other devices employing one or a plurality of islands can be fabricated utilizing this inventive concept.

It should also be appreciated that although the border surrounding the base region and spacing it from the expanded guard region was described as being about 0.001 inch in the preferred embodiment, this distance is related to the intended application and its width can vary accordingly, while still uitlizing the inventive concepts herein disclosed. However, the frequency response of the transistor may be detrimentally affected if the border width is materially increased. The collector-base capacitance, it has been found, is reduced if the border width is minimized.

In order to make the transistor herein described, surface 14 of wafer 12 was cleaned, polished and treated in a conventional and well known fashion to form an oxide coating thereon. This was done as preparation for diffusion of base, emitter and guard ring regions by normal and accepted oxide masking techniques. They included forming an original oxide upon surface 14, etching a window therein to expose a preselected area of surface 14 and diffusing N-type impurities into wafer 12 forming base region 24. An oxide coating was then reformed entirely over surface 14 adding to the thickness of the original unetched oxide coating surrounding the base area. The emitter region 26 was formed by etching a new smaller opening through the reformed oxide coating overlying the base region, and diffusing P-type impurities therein to form emitter region 26.

Simultaneously with the forming of emitter region 26, P+ region 28 was also formed. All of the thick oxide layer overlying surface 14 from border 32 to the perimeter of surface 14 was removed except for that portion overlying islands 38 and 40. During the emitter diffusion, the P-type impurities therefore also diffused into the wafer surface outside the base region forming P+ region 28. An oxide coating was then reformed over the P+ diffusion area, which concurrently increased the thickness of the original thick oxide already covering islands 36 and 38.

A P+ diffusion into a P-type silicon wafer is generally a relatively short-time high-temperature process. For example, in fabrication of the preferred embodiment the entire P+ diffusion process was completed in approximately 8 minutes. This included deposition of the P-type impurities on the wafer surface and their subsequent drive-in in an oxidizing atmosphere. The drive-in temperature was on the order of 1,150° C. The oxide coating formed during this diffusion, herein designated thin coating 44, has a thickness of about 1,000 to 1,500 angstroms. By contrast, the thickness of the oxide coating, herein designated thick coating 42, due to the additive effect of the base and emitter diffusions is on the order of 9,000 angstroms.

Appropriate openings were made in the oxide coating overlying emitter region 26 and base region 24 for contact engagement. These openings were made by conventional etching techniques. Aluminum overlay contacts 20 and 22 were then evaporated onto the oxide and surface 14 using conventional and well known evaporation techniques forming no part of this invention. However, care must be exercised to insure that interdigitated electrodes 49 and 51 form a continuous connection from their respective bonding pads to the base and emitter regions. Moreover, because the underlying surface includes an oxide coating of varying thickness, care must be exercised to insure that these interdigitated electrodes do not constitute high resistance connections. Contact thicknesses in excess of the maximum difference in oxide thickness can insure low resistance connections.

As previously pointed out in bonding the emitter and base connectors to bonding pads, most of the bonding pressure was exerted normal to surface 14. This bonding took place overlying that part of thick coating 42 overlying islands 36 and 38.

If this oxide overlying islands 38 and 40 had not been preserved during the P+ forming diffusion, the bonding pads of the overlay contacts would rest directly on the thin oxide coating 44. The subsequent bonding pressure required to attach emitter wire connector 52 and base wire connector 54 can crack such a thin frangible coating. This, as previously pointed out, could produce short circuiting between the various regions of distinct conductivity.

As previously indicated I have also found that this invention is of practical value in a face-bonded type of transistor chip, such as a flip-chip. The face-bonded chip differs from the device already described in that fine wires are not used to interconnect the contact pads with their respective terminals or larger terminal leads. Instead, an enlarged contact bump is used to interconnect the contact pads with the terminals or larger connecting leads. The connecting leads can be in any convenient form. For example, they may be part of a thick film microcircuit on a ceramic substrate, or converging finger-like projections of a terminal frame stamped from a metal sheet. In most instances the contact bump is formed on the chip, as a projecting part of the chip contact pad. However, the contact bump can alternatively be provided on the connector lead. In either event the flip chip is usually connected to its terminals or terminal leads by pressuring bonding, usually ultrasonic bonding, in which pressure is applied to the chip and its connection point with the contact bump in between. The pressure bonding technique is convenient for chip placement. However, it frequently does not produce a strong enough chip-terminal lead connection. Thus, a solder interface is provided at the joint, which can be subsequently reflowed by merely heating the resultant assembly. This invention is useful regardless as to whether solder reflow is used to enhance the pressure bond.

I have found that pressure bonding a flip-chip to its terminal leads can deleteriously affect a thin oxide coating on the chip surface beneath the contact pads. While this effect is not as pronounced as with respect to a wire bonded device, it still can adversely affect device performance. Accordingly, an island of thick oxide should be used beneath the contact pads on a face-bonded chip also.

Figure 3:
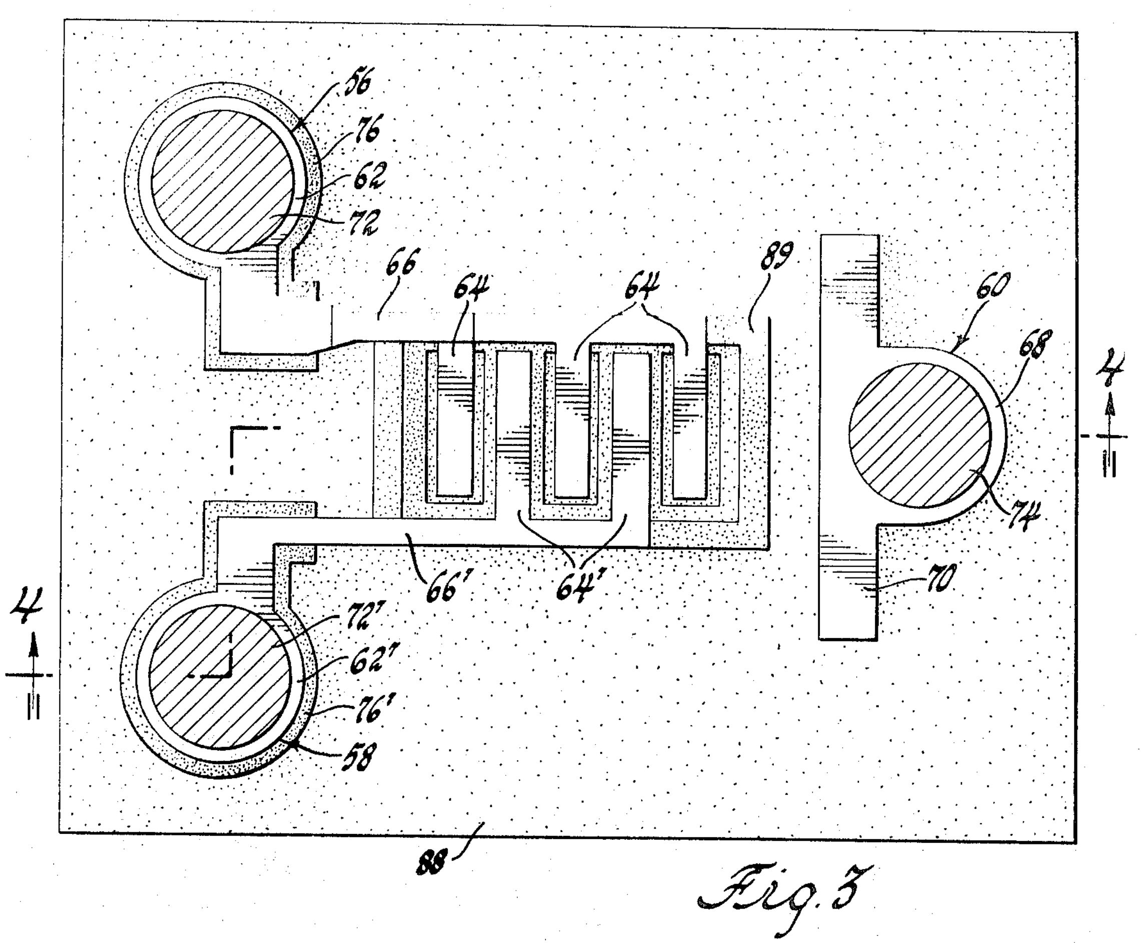
FIG. 3 is an elevational view in partial section along the line 3—3 in FIG. 4 showing a transistor flip-chip incorporating this invention.

FIG. 3 shows such a transistor flip-chip incorporating the thick oxide islands. The chip is approximately 28 mils square, about 8 mils thick, and of 25 ohm-centimeter P-type silicon. Hence, it is of the same high resistivity but somewhat larger than the chip shown in FIGS. 1 and 2 to accommodate contact bumps. Similar to the wire bonded version already described, the wafer has an evaporated aluminum emitter contact 56 and base contact 58 on its upper surface. However, it also has an evaporated aluminum collector contact 60 on the upper surface. Emitter contact 58 has a circular contact pad portion 62 and three electrode fingers 64, which are interconnected with each other and pad 62 by interconnecting portion 66. Base contact 58 similarly has a circular contact pad 62' and two electrode fingers 64', which are connected to each other and with pad 62' by means of interconnecting portion 66'. The base and emitter fingers are interdigitated, as shown. The collector contact 60 has a generally circular pad portion 68 which is generally tangentially connected to a linear portion 70.

Enlarged contact bumps 72 and 72' of silver or the like are disposed on emitter and base contact pads 62 and 62', respectively. A similar contact bump 74 is disposed on collector contact pad 68. The emitter and base contact pads 62 and 62', and adjacent parts of their interconnecting portions 66 and 66', are disposed on islands 76 and 76' of thick oxide. There is no oxide coating beneath collector contact 60 except at its edges, as can be seen better in FIG. 4. Hence, collector contact 60 is directly on the upper surface of the semiconductor chip,not on an oxide coating.

Figure 4:
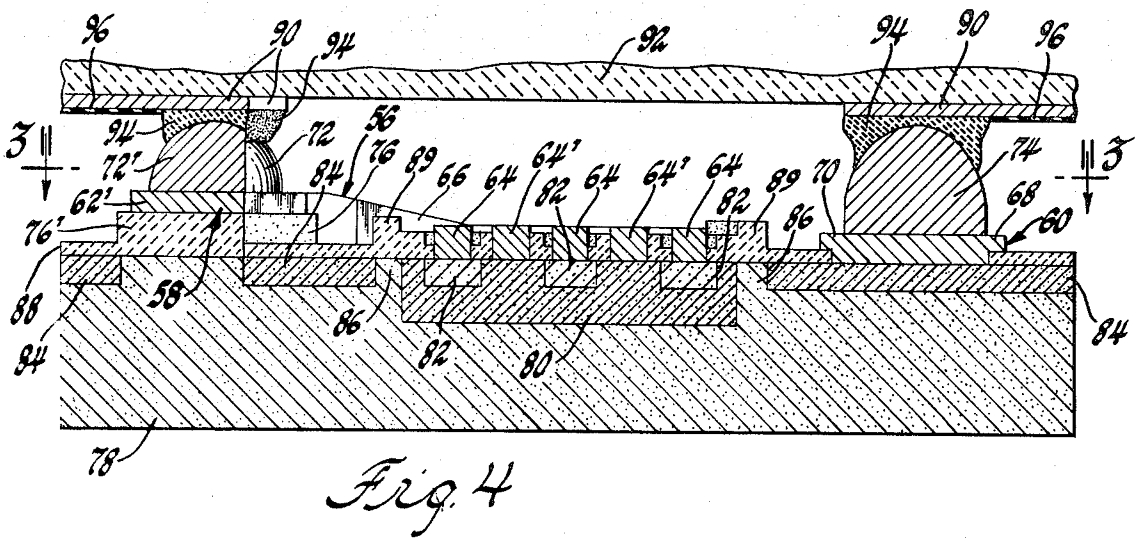
FIG. 4 is a sectional view of a face-bonded transistor chip along the line 4—4 of FIG. 3.

FIG. 4 shows a sectional view of the chip illustrated in FIG. 3 as attached to a thick film conductor pattern on a ceramic substrate. As can be seen, the transistor wafer has a plurality of distinct conductivity type regions similar to the wire bonded device already described. The bulk 78 of the wafer is of high resistivity P-type silicon and forms the collector region for the transistor. An N-type conductivity base region 80 is inset in the surface of the wafer, and three P-type conductivity emitter islands 82 are inset in the base region. A P+ expanded guard ring region 84 is inset in the balance of the upper surface of the wafer excepting beneath the islands 76 and 76' and border region 86 surrounding base region 80. The entire upper surface of the wafer is covered with a continuous oxide coating 88 having openings for emitter fingers 64, base fingers 64' and the collector contact pad. The oxide coating is thickest at 89 over border region 86 and at islands 76 and 76' under which the expanded guard ring region 84 does not extend.

The general dimensions of the base region 80, emitter region 82 and border region 86 are similar to that of the device already described. The P+ expanded guard region 84 is somewhat wider, however, because it extends to the edge of the chip and the chip is of larger size. The flip-chip in FIG. 4 is shown with its contact bumps 72, 72' and 74 attached to thick film cermet connecting leads 90 which have been printed and fired on a ceramic substrate 92. A solder interlayer at the bump-lead interconnection is provided by solder dots 94. The substrate 92 can be of alumina, beryllia or the like.

The same oxide thicknesses for oxide islands 76 and 76' can be used for this embodiment of the invention as for the one shown in FIGS. 1 and 2. Accordingly, I would prefer to have the oxide islands 76 and 76' be about 9,000 angstroms thick. The oxide on the balance of the chip should at least be about 1,000 angstroms to insure adequate passivation.

The various semiconductor regions in the chip, as well as the overlay contacts, are formed in the manner already described. The contact bumps can be solder coated copper balls. They can also be of one or more layers of evaporated metal. The metal can be selectively deposited on the contact pads through a mask. However, I prefer to electroplate them onto their pads through apertures in a resist coating on the slice. The contact bumps can be approximately 1 – 5 mils high and approximately 3 – 4 mils in diameter. The bumps can be of a solder, silver, gold, and other metals. They can be of a single layer, alone, discrete multilayers, or interdiffused multilayers. I prefer to use a single layer of silver. In some instances I may even pretin the silver bump with an overlay of solder (not shown). The solder dots 94 on the conductor leads 90 can be formed by applying a solder resist coating 96 on the connector lead 90 but leaving the end of the connector lead 90 exposed. A solder paste can be screened onto the exposed end of each connector lead, and the solder heated to cause it to coalesce into a dot of appropriate size. The solder resist also prevents the solder from subsequently migrating away from the end of the conductor when the solder is reflowed after chip mounting.

The chip is mounted onto the ceramic substrate by registering the contact bumps 72, 72' and 74 on the solder dots of the corresponding connecting leads, and ultrasonically bonding the bumps to the dots. The resultant assembly is preferably then heated to reflow the solder dots. It should be noted that the contact bumps 72, 72' and 74 could alternatively be provided on the ends of the connecting leads 90 instead. Then, the chip pads would be ultrasonically bonded to the contact bumps, with or without a solder interlayer. In such instance the deleterious effects on the oxide coating could even be more severe, were not the thick oxide islands 76 and 76' of this invention used.

Although this invention has been described with reference to particular embodiments, it is to be understood that the only limitations placed on this invention are contained in the claims.

I claim:

1. A method for making a silicon transistor which comprises:

oxidizing a major surface of a silicon wafer of a first conductivity type;

removing said oxide from a first preselected area of said surface;

diffusing a conductivity determining impurity of a second conductivity type into said first preselected area to form a PN junction;

reforming said oxide over said first preselected area and the balance of said surface thereby increasing the oxide thickness on the balance of said surface;

removing a portion of said reformed oxide overlying a second preselected area within said first preselected area and substantially the balance of said thicker oxide spaced from said first preselected area thereby defining a third preselected area, while preserving the thicker oxide coating over the PN junction and two discrete island portions spaced outside said PN junction within said third preselected area;

diffusing a conductivity determining impurity of said first conductivity type into said second and third preselected areas;

reforming said oxide over said second and third preselected areas and the balance of said surface including said islands thereby producing a thick oxide layer over said islands and a thin oxide layer over said second and third preselected areas;

opening contact windows through said oxide to said surface within said first and second preselected areas;

evaporating overlay contacts onto said surface including bonding pads on said thick oxide layer over said islands; and pressure bonding wire connectors to said bonding pads.

2. A method for making a face-bonding silicon transistor which comprises:

oxidizing a major surface of a silicon wafer of a first conductivity type;

removing said oxide from a first preselected area of said surface;

diffusing a conductivity determining impurity of a second conductivity type into said first preselected area to form a PN junction;

reforming said oxide over said first preselected area and the balance of said surface thereby increasing the oxide thickness on the balance of said surface;

removing a portion of said reformed oxide overlying a second preselected area within said first preselected area and substantially the balance of said thicker oxide spaced from said first preselected area thereby defining a third preselected area, while preserving the thicker oxide coating over the PN junction and two discrete island portions spaced outside said PN junction within said third preselected area;

diffusing a conductivity determining impurity of said first conductivity type into said second and third preselected areas;

reforming said oxide over said second and third preselected areas and the balance of said surface including said islands thereby producing a thick oxide layer over said islands and a thin oxide layer over said second and third preselected areas;

opening contact windows through said oxide to said surface within said first and second preselected areas;

forming overlay contacts on said surface including terminal contact pads on said thick oxide layer over said islands;

forming terminal connector bumps on said contact pads;

pressure bonding a solder coated terminal connector lead to each of said bonding pads; and reflowing said solder to enhance bonding to said contact bumps.

* * * * *